United States Patent [19]

Hall

[11] Patent Number: 4,887,900
[45] Date of Patent: Dec. 19, 1989

[54] POLARIZATION MAINTAINING FIBER INTERFEROMETER AND METHOD FOR SOURCE STABILIZATION

[75] Inventor: David B. Hall, La Crescenta, Calif.

[73] Assignee: Litton Systems, Inc., Beverly Hills, Calif.

[21] Appl. No.: 17,430

[22] Filed: Feb. 20, 1987

[51] Int. Cl.[4] .............................................. G01B 9/02
[52] U.S. Cl. .................................. 356/350; 350/404; 372/32
[58] Field of Search ................ 356/350; 350/400, 404, 350/96.29; 372/32

[56] References Cited

U.S. PATENT DOCUMENTS

| | | | |
|---|---|---|---|
| 4,299,490 | 11/1981 | Cahill et al. | 356/350 |
| 4,410,275 | 10/1983 | Shaw et al. | 356/350 |
| 4,529,262 | 7/1985 | Ashkin et al. | 350/96.29 |

Primary Examiner—Vincent P. McGraw
Assistant Examiner—S. A. Turner
Attorney, Agent, or Firm—Lynn & Lynn

[57] ABSTRACT

The frequency of an optical signal output from an optical source is controlled while maintaining the polarization of the signal by guiding the signal with either a polarization maintaining optical fiber or an integrated optics waveguide. A portion of the signal output from the light source is input to the light guiding structure. The optical signals are phase modulated, and an electrical signal indicative of the intensity of an optical signal output from the polarization maintaining light guiding device is applied to the optical source for controlling the frequency of the optical signal output therefrom.

28 Claims, 10 Drawing Sheets

STABILIZATION OF SCALE FACTOR Vs.
REFERENCE INTERFEROMETER O.P.D.

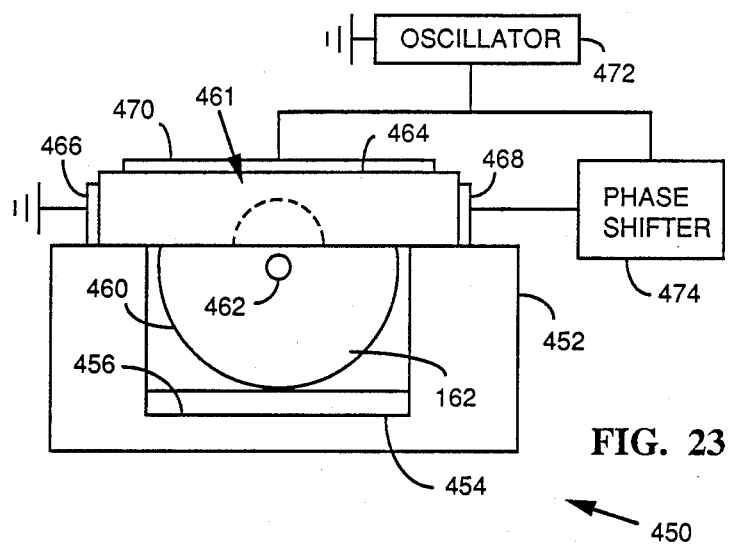
FIG. 23
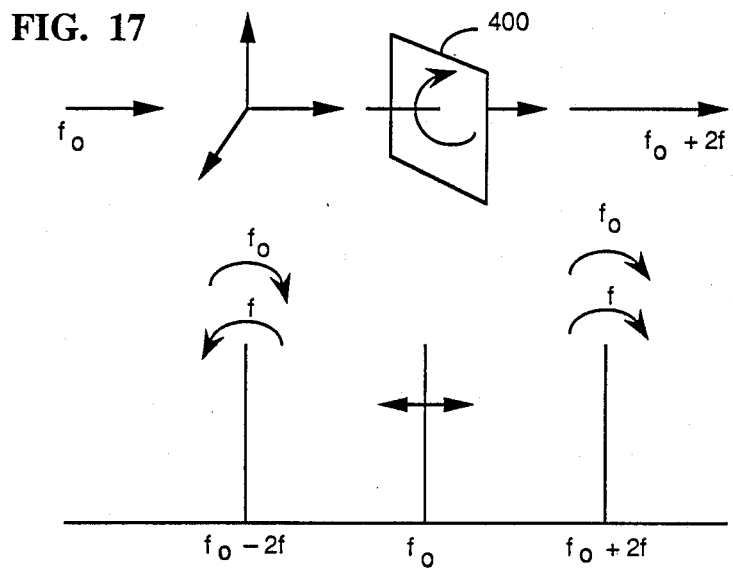
FIG. 17
FIG. 18

POLARIZATION MAINTAINING FIBER INTERFEROMETER AND METHOD FOR SOURCE STABILIZATION

This invention relates generally to apparatus and methods for controlling the frequency of light output from an optical signal source. This invention is particularly related to apparatus and methods for controlling the frequency of optical signals output from coherent light sources.

Stability in the optical signals input to optical fibers is a practical necessity in the development and implementation of sensing systems using optical fibers. Optical sensing systems may use semiconductor diode lasers or superluminescent diodes as light sources. Fiber optic rotation sensors have been used in broadband semiconductor light sources to reduce noise arising from backscattering in the fiber and for reducing errors caused by the optical Kerr effect. High precision fiber optic rotation sensors required a stable light source the wavelength because the scale factor of the sensor depends upon the source wavelength. For example, a navigation grade rotation sensor requires wavelength stability of about one part in $10^6$.

A wideband source such as a superluminescent diode (SLD) or a narrower source such as a single or multimode laser diode needs frequency stabilization in order to be suitable as an optical source for a Sagnac ring fiber optics rotation sensor.

The SLD provides a spectral linewidth sufficient to overcome unwanted phase errors due to coherent backscatter and the Kerr effect.

The fractional linewidth should be between 10 and 100 parts per million (ppm). The frequency stability of the centroid of the source spectral distribution should be several ppm to meet scale factor stability and linearity requirements. Therefore, source width should be minimized within the constraints of coherent backscatter and Kerr effect errors to enhance scale factor linearity. The fractional linewidth should approach the lower portion of the 10 to 1000 ppm range to minimize unwanted errors in scale factor due to changes in the source spectral distribution overtime.

There are at least three groups of laser diodes that are classified according to structure. These are homostructure, single heterostructure and double heterostructure diode lasers.

The simplest diode lasers are called homostructure lasers because they are made of a single semiconductor material. A homostructure laser diode may comprise, for example, regions of n-type and p-type gallium arsenide. Electrons injected from the n-region into the p-region combine with holes, or positive charge carriers, to emit laser light. All laser diodes include two polished parallel faces that are perpendicular to the plane of the junction of the p-type and n-type regions. The emitted light reflects back and forth across the region between the polished surfaces and, consequently is amplified on each pass through the junction.

A typical single heterostructure semiconductor laser includes an additional layer of aluminum gallium arsenide, in which some of the gallium atoms in the gallium arsenide have been replaced by aluminum atoms. The aluminum gallium arsenide layer stops the injected electrons, thereby causing the emission of a higher intensity laser light than ordinarily occurs with a homostructure diode laser.

A typical double heterostructure semiconductor laser includes three layers of gallium arsenide separated by two layers of aluminum gallium arsenide. Preselection of either n-type or p-type materials causes further increases of the intensity of the emitted laser beam.

The wavelength of the light emitted from a laser diode varies as a function of the operating temperature and the injection current applied. Effective use of a laser diode as a light source in an optical rotation sensor requires an output of known wavelength. In fiber optic rotation sensing applications, the frequency stability should be about $\Delta f/f = 10^6$, and the light source should be held at a constant temperature.

Superluminescent diodes used as light sources in fiber optic rotation sensors typically have excessive fractional linewidths of about 10,000 ppm. They also have operating lifetimes of about 100 hours and provide about 500 μW or less optical power into an optical fiber. SLD's have linewidth to frequency stability ratios of about 10,000 and require relatively high injection currents that typically exceed 100 mA. As a result, the short operating lifetime and excessive linewidths make SLD's unacceptable for fiber optic rotation sensors, which should operate reliably for thousands of hours without source replacement.

Single mode laser diodes have the characteristic that modulation of the injection current produces simultaneous amplitude and frequency modulations of the power output. The amplitude modulation has a modulation depth that approaches 100%. Periodic AM modulation at kilohertz or megahertz rates from below or near threshold to a high peak power can produce an output with a continuous spectral distribution exceeding 20 Ghz. It is possible to produce a chirp frequency modulation of the output frequency that exceeds 20 GHz, which is equivalent to a 50 ppm fractional linewidth at a wavelength $\gamma = 820$ nm. Modulation with a pseudo-random noise source of appropriate spectral density can produce an output with a desired spectral distribution and linewidth. Thus single mode laser diodes have the advantages of providing power inputs to an optical fiber in the range of 1-5 mW, long operating lifetime that exceed 10,000 hours, and a linewidth to frequency stability ratio that is adjustable over a range of about 10 to 100.

Multimode laser diodes have adjustable fractional linewidths that are dependent on the number of longitudinal modes that lase. For a five mode laser, the fractional linewidth may be about 1000 ppm at $\gamma = 820$ nm, which corresponds to a wavelength change $\Delta \gamma = 0.2$ nm. Injection current modulation at kilohertz or megahertz rates can smear the discrete longitudinal modes to produce a continuous or quasicontinuous spectral distribution over a fractional linewidth of 1000 ppm. Multimode laser diodes typically provide high power inputs in the range of about 1-10 mW into optical fibers, have operating lifetimes that typically exceed 10,000 hours and have a linewidth to frequency stability ratio in the range of about 100 to 1000.

Some familiarity with polarization of light and propagation of light within an optical fiber will facilitate an understanding of the present invention. Therefore, a brief description of the concepts used to describe the propagation and polarization of a light wave in a fiber is presented.

An optical fiber comprises a central core and a surrounding cladding. The refractive index of the cladding is less than that of the core. The diameter of the core is so small that light guided by the core impinges upon the core-cladding interface at angles less than the critical angle for total internal reflection.

It is well-known that a light wave may be represented by a timevarying electromagnetic field comprising orthogonal electric and magnetic field vectors having a frequency equal to the frequency of the light wave. An electromagnetic wave propagating through a guiding structure can be described by a set of normal modes. The normal modes are the permissible distributions of the electric and magnetic fields within the guiding structure, for example, a fiber optic waveguide. The field distributions are directly related to the distribution of energy within the structure.

The normal modes are generally represented by mathematical functions that describe the field components in the wave in terms of the frequency and spatial distribution in the guiding structure. The specific functions that describe the normal modes of a waveguide depend upon the geometry of the waveguide. For an optical fiber, where the guided wave is confined to a structure having a circular cross section of fixed dimensions, only fields having certain frequencies and spatial distributions will propagate without severe attenuation. The waves having field components that propagate with low attenuation are called normal modes. A single mode fiber will propagate only one spatial distribution of energy, that is, one normal mode, for a signal of a given frequency.

In describing the normal modes, it is convenient to refer to the direction of the electric and magnetic fields relative to the direction of propagation of the wave. If only the electric field vector is perpendicular to the direction of propagation, which is usually called the optic axis, then the wave is a transverse electric (TE) mode. If only the magnetic field vector is perpendicular to the optic axis, the wave is a transverse magnetic (TM) mode. If both the electric and magnetic field vectors are perpendicular to the optic axis, then the wave is a transverse electromagnetic (TEM) mode.

None of the normal modes require a definite direction of the field components. In a TE mode, for example, the electric field may be in any direction that is perpendicular to the optic axis. The direction of the electric field vector in an electromagnetic wave is the polarization of the wave. In general, a wave will have random polarization in which there is a uniform distribution of electric field vectors pointing in all directions permissible for a given mode. If all the electric field vectors in a wave point in only a particular direction, the wave is linearly polarized. If the electric field consists of two orthogonal electric field components of equal magnitude and a phase difference of 90°, the electric field is cicularly polarized, because the net electric field is a vector that rotates around the propagation direction at an angular velocity equal to the frequency of the wave. If the two linear polarizations are unequal or have a phase difference other than 90°, the wave has elliptical polarization. In general, any arbitrary polarization can be represented by the sum of two orthogonal linear polarizations, two oppositely directed circular polarizations or two counter rotating elliptical polarizations that have orthogonal major axes.

The boundary between the core and cladding of a fiber optic waveguide is a dielectric interface at which certain well-known boundary conditions on the field components must be satisfied. For example, the component of the electric field parallel to the interface must be continuous. A single mode optical fiber propagates electromagnetic energy having an electric field component perpendicular to the core-cladding interface. Since the fiber core has an index of refraction greater than that of the cladding and light impinges upon the interface at angles greater than or equal to the critical angle, essentially all of the electric field remains in the core by internal reflection at the interface. To satisfy both the continuity and internal reflection requirements, the radial electric field component in the cladding must be a rapidly decaying exponential function. An exponentially decaying electric field is usually called the "evanescent field."

The velocity of an optical signal depends upon the index of refraction of the medium through which the light propagates. Certain materials have different refractive indices for different polarizations. A material that has two refractive indices is said to be birefringent. The polarization of the signal propagating along a single mode optical fiber is sometimes referred to as a mode. A standard single mode optical fiber may be regarded as a two mode fiber because it will propagate two waves of the same frequency and spatial distribution that have two different polarizations. Two different polarization components of the same normal mode can propagate through a birefringent material unchanged except for a velocity difference between the two polarizations.

In summary, any polarized light can be represented by two circularly polarized waves having proper phase and amplitude. Alternatively, the light could be represented by either elliptically rotating components or by perpendicular linearly polarized components of the electric field.

There are a number of birefringent materials. Depending on their structure and orientation to the light propagating through it, certain crystals are circularly birefringent; some crystals are linearly birefringent. Other types of crystals, for example quartz, can have both circular birefringence and linear birefringence so as to produce elliptical birefringence for a light wave propagating in a properly chosen direction.

Optical wave behavior is different from that in a uniform medium if layers of two materials with different refractive indices are stratified optically and periodically. When the thickness of each layer is sufficiently small compared with the light wavelength and the number of layers is sufficiently large, the compound medium is birefringent. Form birefringence results from an ordered arrangement of layers of optically isotropic materials having dimensions that are large compared with the molecules of the materials, but small when compared with the optical wavelength propagating in the fiber. Fiber optic devices using form birefringent fibers are useful in constructing gyroscopes, sensors, frequency shifters and communications systems.

SUMMARY OF THE INVENTION

The present invention provides an apparatus and a method for overcoming the difficulties in stabilizing the frequency of optical signals output from light sources such as those used in optical rotation sensors.

A device according to the invention for controlling the frequency of an optical signal output from a optical source comprises means for guiding an optical signal while maintaining the polarization of the signal. The guiding means may be either a polarization maintaining optical fiber or an integrated optics waveguide configured to maintain the polarization of optical signals. The device further includes means for introducing a portion of the signal output from the light source into the polarization maintaining guiding means and means for modulating the phase of optical signals guided by the polarization maintaining guiding means. An electrical signal indicative of the intensity of an optical signal output from the polarization maintaining guiding means is produced and applied to the optical source for controlling the frequency of the optical signal output therefrom.

The device according to the invention may further include a first polarizer having a polarization axis oriented at 45° to the principal axes of the polarization maintaining guiding means. The first polarizer is positioned to provide light of a predetermined polarization to the polarization maintaining guiding means. A second polarizer having a polarization axis oriented at 45° to the principal axes of the polarization maintaining guiding means is positioned to receive optical signals output from the polarization maintaining guiding means. These signals are then detected with suitable means for detecting optical signals.

The device according to the invention may also further include a band pass filter connected to the detector. The band pass filter is formed to have an output signal of a predetermined modulation frequency. The output of the bandpass filter is synchronously detected, and an error signal from the synchronous detector is applied to the optical source such that the optical source produces an optical signal having a frequency that causes a reduction in the error signal.

The device according to the invention may further include a driver oscillator connected to the phase modulator to modulate the phase of optical signals guided by the polarization maintaining guiding means at the modulation frequency.

The method of the invention for controlling the frequency of an optical signal output from a optical source, comprises the steps of guiding an optical signal while maintaining the polarization of the signal and introducing a portion of the signal output from the light source into the polarization maintaining guiding means. The method further includes modulating the phase of optical signals guided by the polarization maintaining guiding means and producing an electrical signal indicative of the intensity of an optical signal output from the polarization maintaining guiding means. The electrical signal is an error signal that is then applied to the optical source for controlling the frequency of the optical signal output therefrom.

The method may further include providing light of a predetermined polarization to the polarization maintaining guiding means. The output of the polarization maintaining guiding means is analyzed to provide an optical signal having only a selected polarization. Signals having the selected polarization are detected.

The method may further include connecting band pass filter means to the detecting means to provide an output signal of a predetermined modulation frequency; connecting synchronous detector means to the band pass filter means to receive the output signal therefrom; and providing an error signal from the synchronous detector means to the optical source such that the optical source produces an optical signal having a frequency that causes a reduction in the error signal.

The method may also further include the step of connecting a driver oscillator to the phase modulator to modulate the phase of optical signals guided by the polarization maintaining guiding means at the modulation frequency.

BRIEF DESCRIPTION OF THE DRAWINGS

FIGS. 17 and 18 illustrate the effect of a frequency shifter on an optical wave;

FIG. 23 illustrates a second structure for a frequency shifter that may be included in the fiber optic rotation sensor of FIG. 14.

DESCRIPTION OF THE PREFERRED EMBODIMENT

Figure 1:
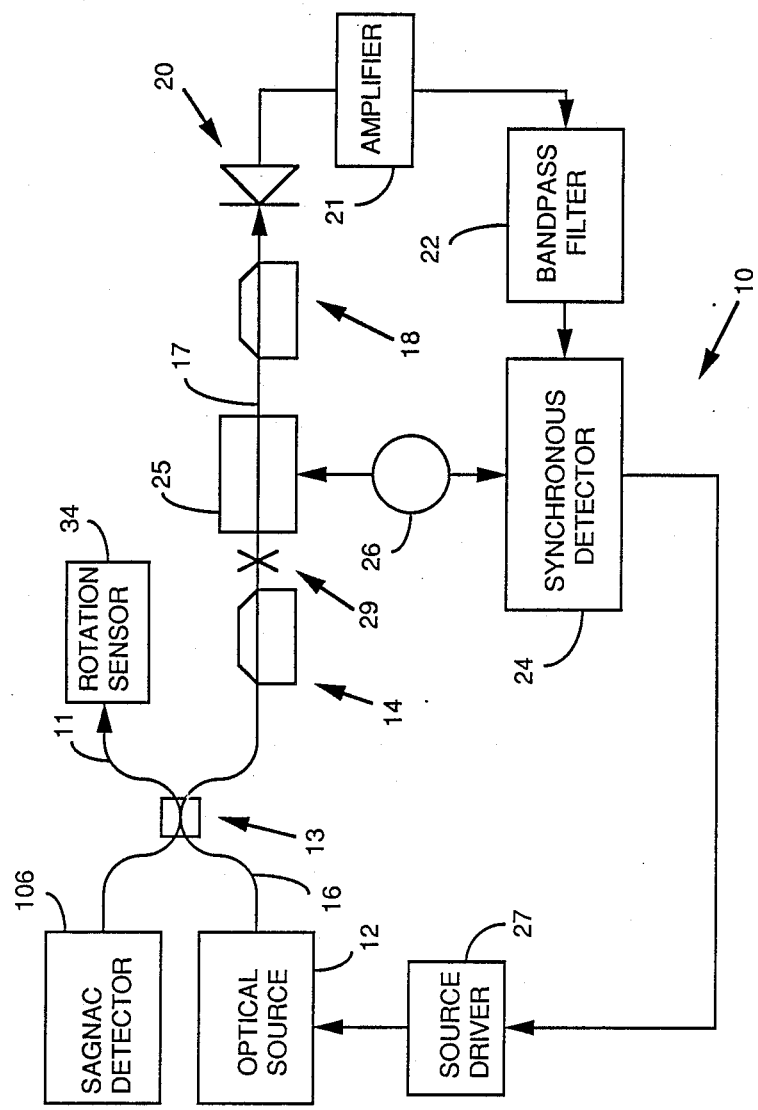
FIG. 1 is a schematic diagram of a frequency control system according to the invention.

Referring to FIG. 1, an optical source controller system 10 for controlling the wavelength output from an optical signal source 12 includes an optical coupler 13, an optical fiber 16, a length of a fiber polarization maintaining fiber 17, a polarizer 14, an analyzer 18, a photodetector 20, an amplifier 21, a band pass filter 22, a synchronous detector 24, a phase modulator 25, a driver oscillator 26 and a source driver 27.

The optical source 12 is preferably a solid state laser diode or a superluminescent diode (SLD). Light from the optical source 12 propagates through the fiber 16 and is then input to the coupler 13, which couples a portion of the light into a fiber 11. The fiber 11 guides the coupled light to a device such as a rotation sensing system 40 shown in FIG. 14. The coupled light may be guided to other optical systems (not shown) that require source stabilization. The light remaining in the fiber 16 then propagates to a junction 29 of the fiber 16 and the polarization maintaining fiber 17. The fiber 16 and the polarization maintaining fiber 17 may be butt-coupled together in a manner well known in the art.

Before reaching to the polarization maintaining fiber 17, the light passes through the polarizer 14, which transmits a beam that is linearly polarized at an angle of 45° to the principal axes of the fiber 17. The polarization maintaining fiber 17 may be formed by a variety of techniques described subsequently. A polarization maintaining fiber has refractive indices that differ significantly for different polarizations. Since the light input to the fiber 17 has polarization components along both of the fiber axes, both of these polarizations will propagate in the fiber 17 without mixing together.

Figure 14:
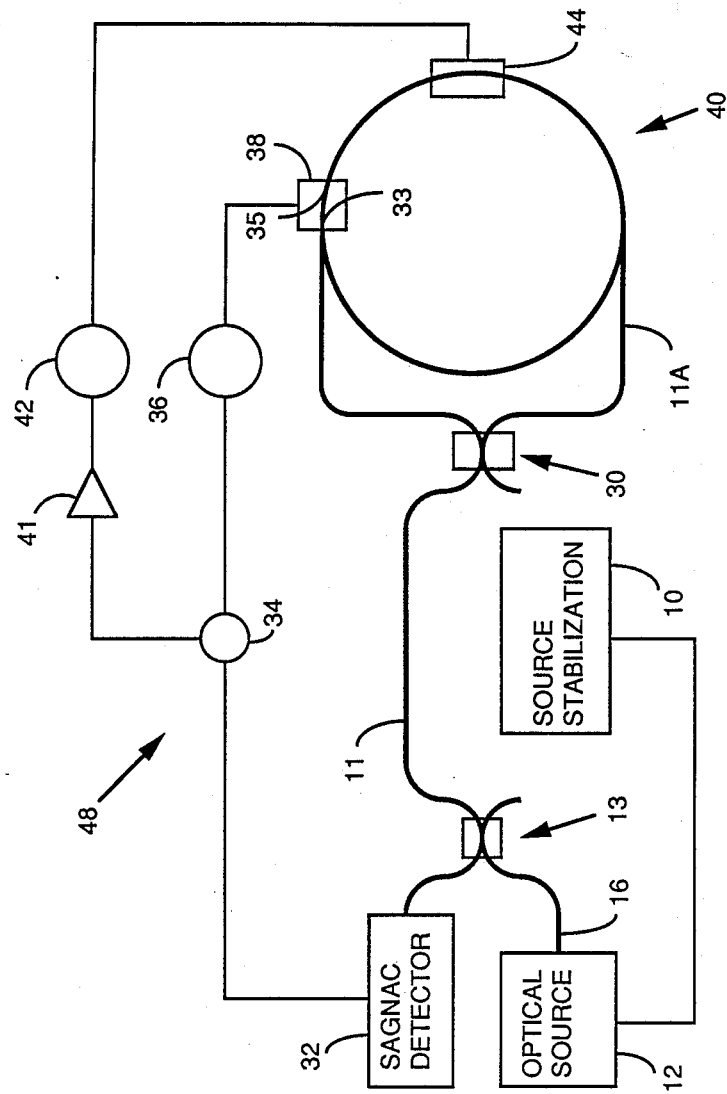
FIG. 14 illustrates a fiber optic rotation sensing system that includes the frequency control system of FIG. 1.

Referring to FIG. 14, the fiber optic rotation sensor 40 comprises a sensing loop 11A formed in the fiber 11. The input signal propagates through the fiber 11 to an optical coupler 30 that divides the light to produce light waves that propagate counterclockwise (CCW) and clockwise (CW) through the loop 11A. After trasversing the loop 11A, the waves then impinge upon the optical coupler 30. The optical coupler 30 then combines portions of the waves so that a superposition of the CW and CCW waves propagates back through the fiber 11 to the optical coupler 13, which directs a portion of the combined waves to a Sagnac detector 32, which may be any suitable photodiode.

The output of the Sagnac detector 32 is an electrical signal indicative of the rotation rate of the sensing loop 11A about its sensing axis, which may be a line perpendicular to the plane of the loop 11A. The wave traveling around the sensing loop 11A in the direction of rotation will have a longer transit time in the loop than the wave traveling opposite to the direction of rotation. This difference in transit time is detected as a phase shift in the CW and CCW waves. The amount of phase shift is a function of the rotation rate and the wavelength of the light input to the sensing loop 11A. A scale factor relates the rotation rate to the parameters of the rotation sensing system 40.

The electrical output of the Sagnac detector 32 is input to a summing amplifier 34 that also receives signals from an oscillator 36. The oscillator 36 drives a phase modulator 38 that is formed to adjust the phase of light in the sensing loop 11A. The output of the summing amplifier 34 is input to a second amplifier 41 that produces a control signal that is input to an oscillator 42. The oscillator 42 may be a voltage controlled oscillator whose output is a function of the voltage output from the amplifier 41. The oscillator 42 drives a frequency shifter 44 that adjusts the frequency of light in the sensing loop. A serrodyne phase modulator 46, described below with reference to FIGS. 7 and 8, may be substituted for the frequency shifter 44. The oscillator is preferably a sawtooth wave generator.

The summing amplifier 34, oscillator 36, phase modulator 38, amplifier 41, oscillator and frequency shifter 44 (or phase modulator 46) comprise a phase nulling servo loop 48. In order to provide a wider dynamic range, the servo loop 48 adjusts the light in the sensing loop 11A to null the phase differences caused by rotations of the sensing loop. The rotation rate is determined by measuring the oscillator 42 output required to null the rotation induced phase shift.

The fiber optic components of the system 10 will be described before a detailed description of the method of operation of the present invention is presented.

A fiber optic directional coupler suitable for use in single mode applications as the coupler 13 of FIG. 1 and the coupler 30 of FIG. 14 is described in the Mar. 29, 1980 issue of Electronics Letters, Vol. 28, No. 28. pp. 260-261 and in U.S. Pat. No. 4,493,528 issued Jan. 15, 1985 to Shaw et al. and assigned to the Board of Trustees of the Leland Stanford Junior University. The disclosure of that patent is incorporated by reference into this disclosure.

Figure 2:
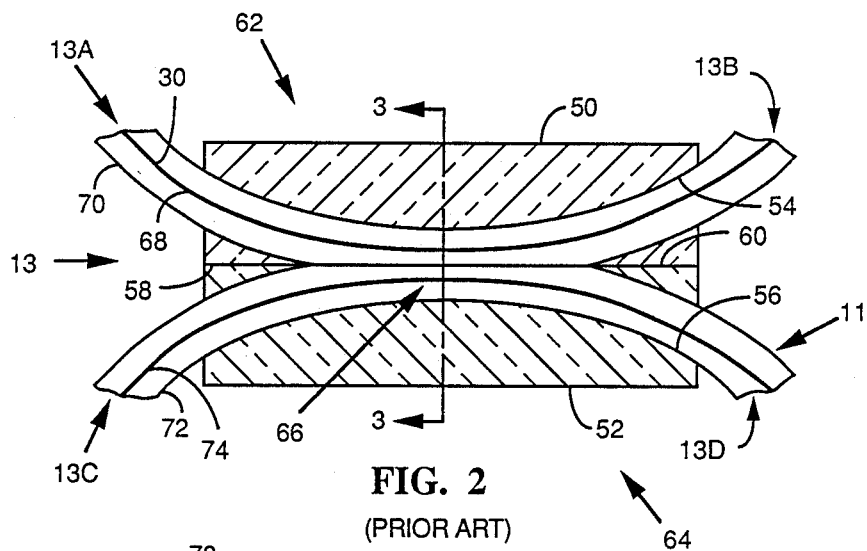
FIG. 2 is a cross sectional view of an optical coupler that may be included in the dual fiber optic gyroscope of FIG. 1.
Figure 3:
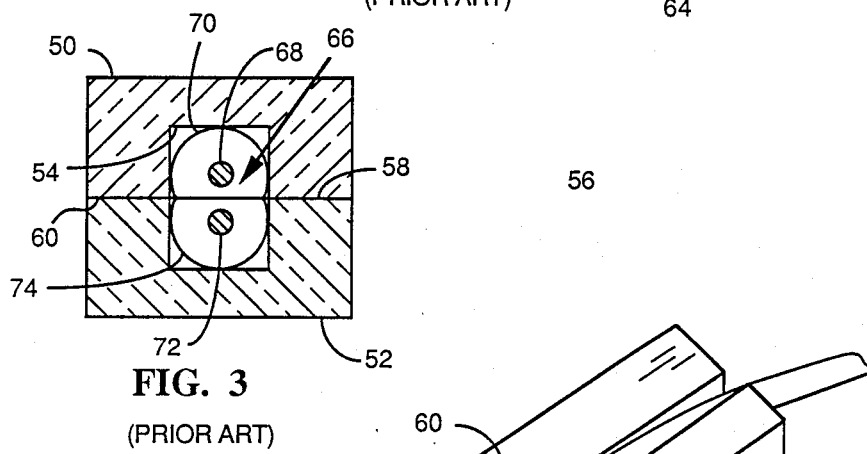
FIG. 3 is a cross sectional view about line 3—3 of FIG. 2.
Figure 4:
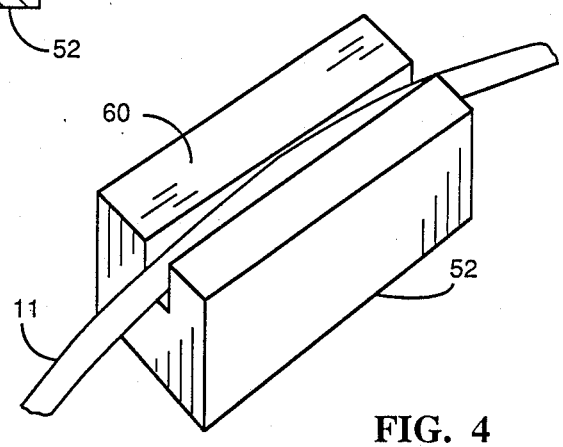
FIG. 4 is a perspective view showing an oval surface on a portion of an optical fiber included in the fiber optic evanescent field coupler of FIGS. 2 and 3.

As illustrated in FIGS. 2-4, the coupler 13 includes the optical fibers 11 and 16 of FIG. 1 mounted in a pair of substrates 50 and 52, respectively. The fiber 11 is mounted in a curved groove 54 formed in an optically flat surface 58 of the substrate 50. Similarly, the fiber 16 is mounted in a curved groove 56 formed in an optically flat surface 60 of the substrate 52. The substrate 50 and fiber 11 mounted therein comprise a coupler half 62, and the substrate 52 and fiber 16 mounted therein comprise a coupler half 64.

The curved grooves 54 and 56 each have a radius of curvature that is large compared to the diameters of the fibers 11 and 16, which are ordinarily substantially identical. The widths of the grooves 54 and 56 are slightly larger than the fiber diameters to permit the fibers 11 and 16 to conform to the paths defined by the bottom walls of the grooves 54 and 56, respectively. The depths of the grooves 54 and 56 vary from a minimum at the center of the substrates 50 and 52, respectively, to a maximum at the edges of the substrates 50 and 52. The variation in groove depth permits the optical fibers 11 and 16, when mounted in the grooves 54 and 56, respectively, to gradually converge toward the centers and diverge toward the edges of the substrates 50 and 52, respectively. The gradual curvature of the fibers 11 and 16 prevents the occurrence of sharp bends or other abrupt changes in direction of the fibers 11 and 16 to avoid power loss through mode perturbation. The grooves 54 and 56 may be rectangular in cross section; however, other cross sectional configurations such as U-shaped or V-shaped may be used in forming the coupler 13.

Referring still to FIGS. 2-4, at the centers of the substrates 50 and 52, the depths of the grooves 54 and 56 are less than the diameters of the fibers 11 and 16. At the edges of the substrates 50 and 52, the depths of the grooves 54 and 56 are preferably at least as great as the fiber diameters. Fiber optic material is removed from each of the fibers 11 and 16 by any suitable method, such as lapping, to form oval-shaped planar surfaces in the fibers 11 and 16 that are coplanar with the confronting surfaces 58 and 60 of the substrates 50 and 52. The oval surfaces are juxtaposed in facing relationship to form an interaction region 66 where the evanescent field of light propagated by each of the fibers 11 and 16 interacts with the other fiber. The amount of fiber optic material removed increases gradually from zero near the edges of the substrates 50 and 52 to a maximum amount at their centers. As shown in FIGS. 2 and 3, the tapered removal of fiber optic material enables the fibers 11 and 16 to converge and diverge gradually, which is advantageous for avoiding backward reflection and excessive loss of light energy at the interaction region 66.

Light is transferred between the fibers 11 and 16 by evanescent field coupling at the interaction region 66. The optical fiber 11 comprises a central core 68 and a surrounding cladding 70. The fiber 16 has a core 72 and a cladding 74 that are substantially identical to the core 68 and cladding 70, respectively. The core 68 has a refractive index that is greater than that of the cladding 70, and the diameter of the core 68 is such that light propagating within the core 68 internally reflects at the core-cladding interface. Most of the optical energy guided by the optical fiber 11 is confined to its core 68. However, solving the wave equations for the fiber 68 and applying the well-known boundary conditions shows that the energy distribution, although primarily in the core 68, includes a portion that extends into the cladding and decays exponentially as the radius from the center of the fiber increases. The exponentially decaying portion of the energy distribution within the fiber 68 is generally called the evanescent field. If the evanescent field of the optical energy initially propagated by the fiber 11 extends a sufficient distance into the fiber 16, energy will couple from the fiber 11 into the fiber 16.

To ensure proper evanescent field coupling, the amount of material removed from the fibers 11 and 16 must be carefully controlled so that the spacing between the cores of the fibers 11 and 16 is within a predetermined critical zone. The evanescent field extends a short distance into the cladding and decreases rapidly in magnitude with distance outside the fiber core. Thus, sufficient fiber optic material should be removed to permit overlap between the evanescent fields of waves propagated by the two fibers 11 and 16. If too little material is removed, the cores will not be sufficiently close to permit the evanescent fields to cause the desired interaction of the guided waves; and therefore, insufficient coupling will result.

Removal of too much material alters the propagation characteristics of the fibers, resulting in loss of light energy from the fibers due to mode perturbation. However, when the spacing between the cores of the fibers 11 and 16 is within the critical zone, each fiber 11 and 16 receives a significant portion of the evanescent field energy from the other to achieve good coupling without significant energy loss. The critical zone includes the region in which the evanescent fields of the fibers 11 and 16 overlap sufficiently to provide good evanescent field coupling with each core being within the evanescent field of light guided by the other core. It is believed that for weakly guided modes, such as the $HE_{11}$ mode guided by single mode fibers, mode perturbation occurs when the fiber core is exposed. Therefore, the critical zone is the core spacing that causes the evanescent fields to overlap sufficiently to cause coupling without causing substantial mode perturbation induced power loss.

The extent of the critical zone for a particular coupler depends upon a number of factors, such as the parameters of the fibers and the geometry of the coupler. The critical zone may be quite narrow for a single mode fiber having a step index profile. The center-to-center spacing of the fibers 11 and 16 is typically less than two to three core diameters.

The coupler 13 of FIG. 2 includes four ports labeled 13A, 13B, 13C and 13D. Ports 13A and 13B, which are on the left and right sides, respectively, of the coupler 13 correspond to the fiber 11. The ports 13C and 13D similarly correspond to the fiber 16. For purposes of explanation, it is assumed that an optical signal input is applied to port 13A through the fiber 11. The signal passes through the coupler 13 and is output at either one or both of ports 13B or 13D depending upon the amount of coupling between the fibers 11 and 16. The "coupling constant" is defined as the ratio of the coupled power to the total output power. In the above example, the coupling constant is the ratio of the power output at port 13D divided by the sum of the power output at the ports 13B and 13D. This ratio is sometimes called the "coupling efficiency", which is typically expressed as a percent. Therefore, when the term "coupling constant" is used herein, it should be understood that the corresponding coupling efficiency is equal to the coupling constant times 100.

The coupler 13 may be tuned to adjust the coupling constant to any desired value between zero and 1.0 by offsetting the confronting surfaces of the fibers 11 and 16 to control the dimensions of the region of overlap of the evanescent fields. Tuning may be accomplished by sliding the substrates 50 and 52 laterally or longitudinally relative to one another.

Light that is cross-coupled from one of the fibers 11 and 16 to the other undergoes a phase shift of $\pi/2$, but light that passes straight through the coupler 13 without being cross-coupled is not shifted in phase. For example, if the coupler 13 has a coupling constant of 0.5, and an optical signal is input to port 13A, then the outputs at ports 13B and 13D will be of equal magnitude, but the output at port 13D will be shifted in phase by $\pi/2$ relative to the output at port 13B.

The polarizers 14 and 18 described herein may be essentially identical to the polarizer disclosed in U.S. Pat. No. 4,386,822 to Bergh and assigned to the Board of Trustees of the Leland Stanford Junior University. The disclosure of that patent is incorporated by reference into this disclosure.

Figure 11:
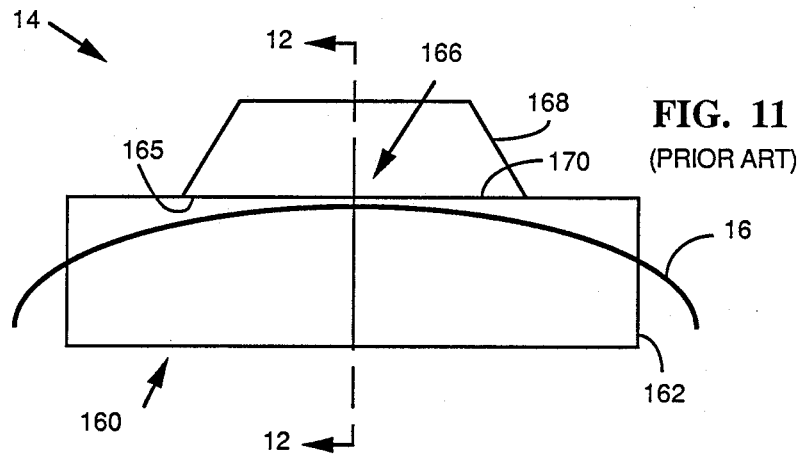
FIG. 11 is a cross sectional view of a polarizer that may be included in the frequency control circuit of FIG. 1.
Figure 12:
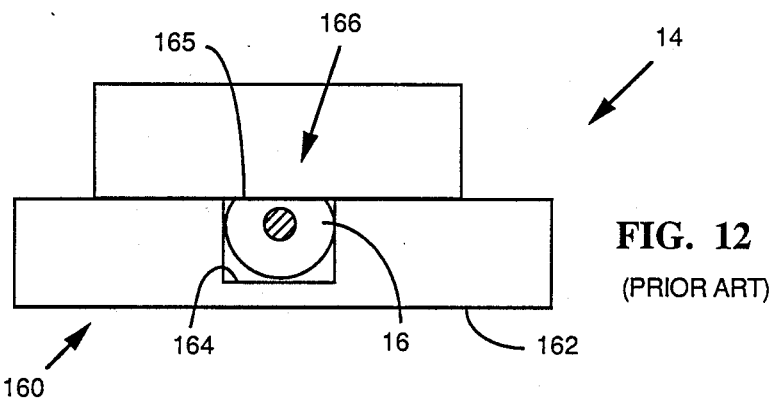
FIG. 12 is a cross sectional view about line 12—12 of FIG. 11.

Referring to FIGS. 11 and 12, the polarizer 14 includes a half coupler 160 that comprises a substrate 162, preferably formed of a quartz block, having a curved groove 164 therein. A length of the optical fiber 16 is secured in the groove 164. A portion of the substrate 160 has been ground and into the cladding of the fiber 16. The grinding and polishing operation removes a portion of the cladding to form an interaction region 166. An optically flat surface 165 of a birefringent crystal 170 is mounted to a surface 170 of the substrate 160. In the interaction region, the evanescent field of light propagating in the fiber 16 interacts with the birefringent crystal 168.

If the fiber 16 is a single mode fiber, then the only modes propagated are those in which the directions of the electric and magnetic fields are approximately perpendicular to the direction of propagation of the wave through the fiber 16.

The crystal 168 is arranged so that for light polarized perpendicular to the crystal-fiber interface, the refractive index of the crystal 168 is less than the refractive index of the fiber 168. Therefore, light propagating within the optical fiber 16 with a polarization perpendicular to the crystal-fiber interface tends to remain in the optical fiber 16 because of internal reflections at the crystal-fiber interface. The index of refraction of the crystal 168 for polarizations parallel to the crystal-fiber interface is chosen to be greater than the index of refraction of the optical fiber 16 so that light parallel to the crystal-fiber interface couples out of the optical fiber 16 into the birefringent crystal 168.

Figure 13:
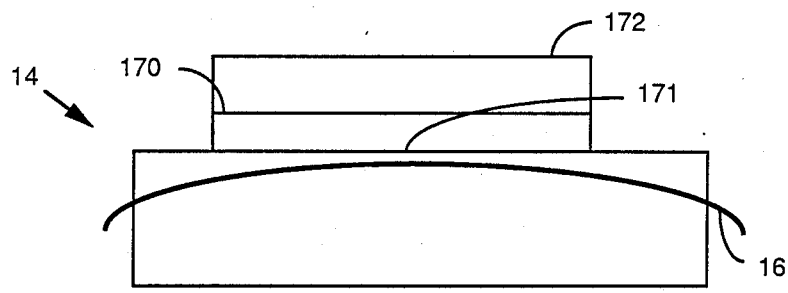
FIG. 13 illustrates a second type of polarizer that may be included in the system of FIG. 1.

Referring to FIG. 13, a polarizer 14 suitable for use in the system 10 includes a layer 170 of a dielectic buffer such as $CaF_2$ adjacent a flattened region 171 on the cladding. A metal layer 172 is placed on the buffer layer 170. The undesired polarization in attenuated while attempting to propagate in the fiber 16 past the flattened region 171. The desired polarization passes through substantially unattenuated.

Figure 5:
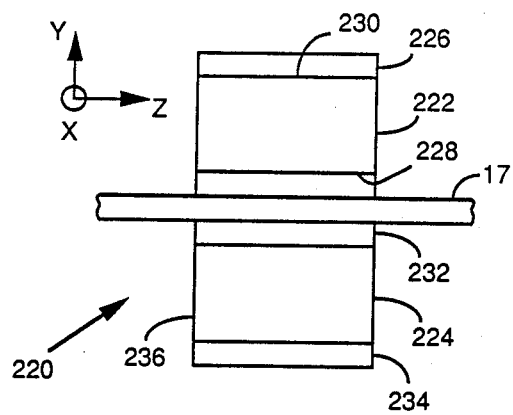
FIG. 5 is a side view of a fiber squeezer that may function as a phase modulator in the frequency control system of FIG. 1.
Figure 6:
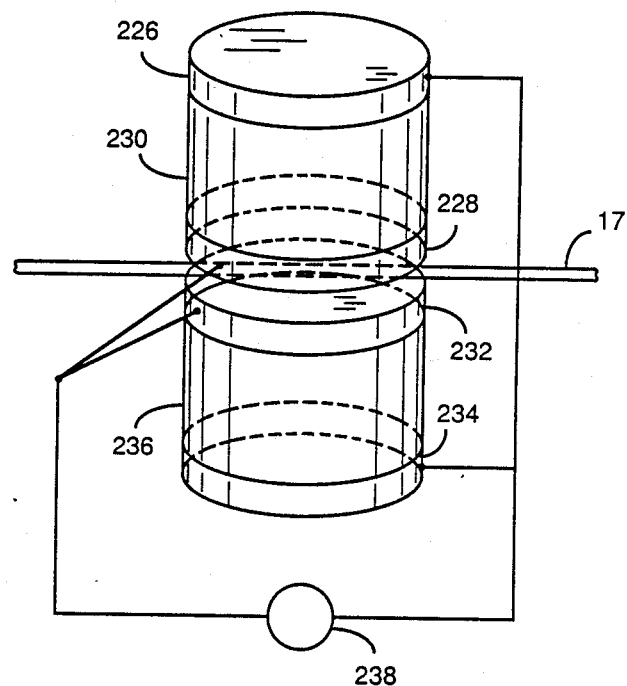
FIG. 6 is a perspective view of the fiber squeezer of FIG. 5.

A phase modulator 220 that may be used in the present invention is shown in FIGS. 5 and 6. The fiber 17 is held between a pair of piezoelectric transducers 222 and 224. The piezoelectric transducers 222 and 224 apply a time varying compression to the fiber 17.

The polarization maintaining fiber 17 has different refractive indices for the two possible linear polarizations. Since the velocity of propagation is $v=c/n$, the two polarizations may be characterized as a fast wave and a slow wave. The two waves experience different time delays in traversing the portion of the fiber 17 held in the phase modulator 220.

The piezoelectric transducer 222 includes a pair of electrodes 226 and 228 mounted on opposite sides of a piezoelectric material 230. The piezoelectric transducer 224 is preferably identical to the piezoelectric transducer 222 and includes a pair of electrodes 232 and 234 mounted on opposite sides of a piezoelectric material 236. An oscillator 238 is connected to the electrodes 226, 228, 232 and 234 to apply voltages from the oscillator 238 across the piezoelectric materials 230 and 236. These voltages cause the transducers 222 and 224 to compress the fiber 17. Squeezing the fiber 11 changes the transit times of the the fast and slow waves by changing the length of the fiber 17.

Figure 7A:
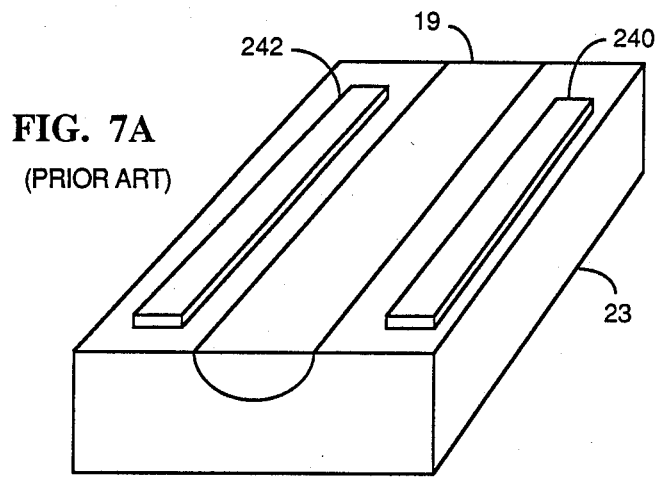
FIG. 7A is a perspective view of a second type of phase modulator that may be included in the frequency control system of FIG. 1.
Figure 7B:
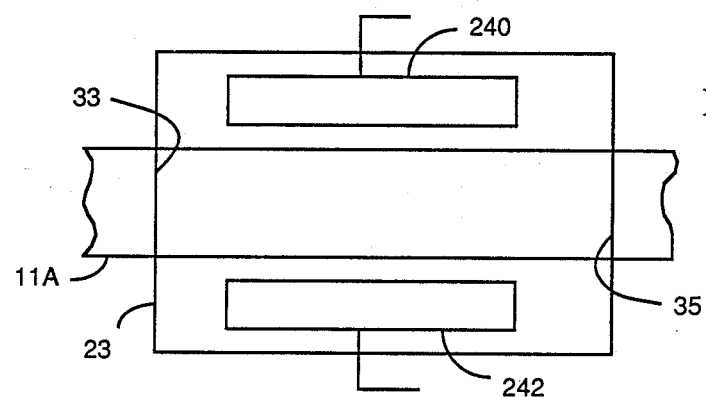
FIG. 7B is a plan view of the phase modulator of FIG. 7A.
Figure 8:
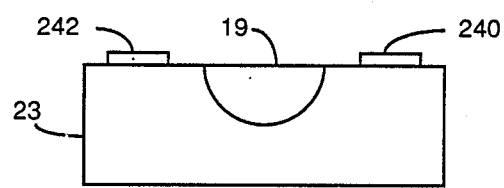
FIG. 8 is an end elevation view of the phase modulator of FIG. 7.

Referring to FIGS. 7A and 7B, the phase modulators 25, 38 and 44 may each comprise an optical waveguide 19 formed on a substrate 23 of an electrooptically active material such as lithium niobate. A pair of electrodes 240 and 242 are attached to the substrate on opposite sides of the waveguide 19. The electrodes 25 and 27 may be formed on the substrate 23 by vapor deposition of aluminum. The optical waveguide 19 may be formed in the substrate 23 by first depositing a strip of titanium on the substrate 23 and heating it to drive the titanium into the substrate 23. The resulting waveguide 19 has a generally semicircular cross section as shown in FIG. 8. Referring to FIGS. 7 and 14, the fiber sensing coil 11A must be cut to have two ends 33 and 35 that are butt-coupled to opposite sides of the optical waveguide 19 as shown in FIG. 7.

Application of a voltage across the electrodes changes the refractive index of the optical waveguide 19 by means of the electrooptic effect. The transit time of a light wave through the waveguide 19 is the the product of the length of the waveguide and its refractive index divided by the speed of light in a vacuum. Changing the refractive index of the optical waveguide 19 thus changes the transit time of an optical signal through it. Because of the sinusoidal nature of the electomagnetic fields that comprise the light wave, the change in transit time is seen as a change in phase of the wave.

A polarization maintaining fiber has refractive indices that differ significantly for different polarizations. Since the light input to the fiber 17 has polarization components along both of the fiber axes, both of these polarizations will propagate in the fiber without mixing together. The polarization maintaining fiber 17 may be formed by a variety of techniques described subsequently.

Since the velocity of light in the fiber 17 is $v=c/n$, where c is the speed of light in a vacuum and n is the refractive index of the fiber for the particular polarization under consideration, the two polarizations have different velocities in the fiber. The slow wave has velocity $v_s=c/n_1$, and the fast wave has velocity $v_f=c/n_2$, where $n_2<n_1$. The fiber 17 converts the linearly polarized light input into an elliptically polarized wave due to the superposition of the orthogonal fast and slow waves.

Figure 9:
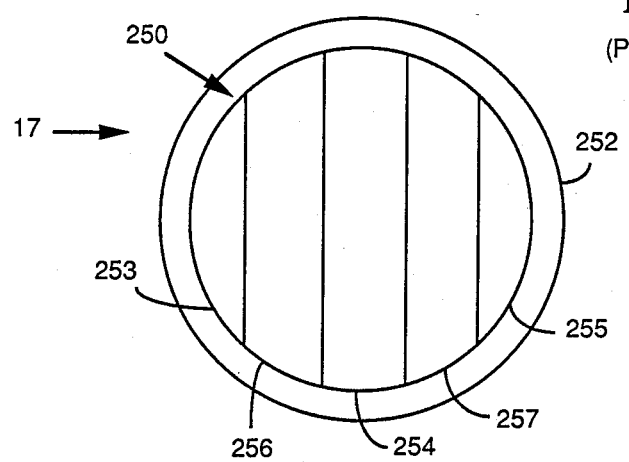
FIG. 9 is a cross sectional view of a polarization maintaining fiber that may be included in the frequency control circuit of FIG. 1.

One type of polarization maintaining fiber has a layered core 250 and a surrounding cladding 252 as shown in FIG. 9. The core 250 has different refractive indices for waves of different polarization so that the propagation constants of the core are polarization-dependent. The cladding 252 has a refractive index that is less than both of the core refractive indices. Light incident upon an interface between two dissimilar dielectrics from the material having the greater refractive index will be internally reflected if the angle of incidence is less than a critical angle. Therefore, the polarization maintaining fiber guides light of both polarizations. Since the propagation constants of the core are different or non-degenerate for the two polarizations, energy does not readily couple between them. Therefore, light propagated by the polarization maintaining fiber of FIG. 9 experiences no change in polarization.

A core having birefringent properties can be synthesized by properly choosing materials for the layers to have particular refractive indices and thicknesses. Referring to FIG. 9, the core 200 is comprised of layers 253-255 of a first material and layers 256 and 257 of a second material having an index of refraction different from the first material. The core 250 may comprise many layers of the two materials, but only the five layers 253-257 are shown for convenience of illustration and explanation.

The core 250 is shown to be circular in cross section, as in most optical fibers. The materials comprising the core 250 and cladding 252 are chosen such that the core indices of refraction for polarization along the z-axis and the y-axis are greater that the index of the cladding 252. Therefore, a wave polarized along the z-direction input to the form fiber 17 of FIG. 1 will remain polarized in the z-direction.

Unlike ordinary optical fibers, the form birefringent single mode fiber 17 will maintain the polarization state of a wave propagating therein. In the fiber 17, the difference between the refractive indices for the two polarizations is sufficiently large that there is a substantial difference between the propagation constants of waves having the two orthogonal polarizations. The difference between the propagation constants eliminates the degeneracy between the polarization states and prevents waves of one polarization from coupling to the other polarization under ordinary conditions. Coupling of energy between waves requires that the waves have essentially the same velocity. If the velocities are different, there is no appreciable coupling between the two states.

Figure 10:
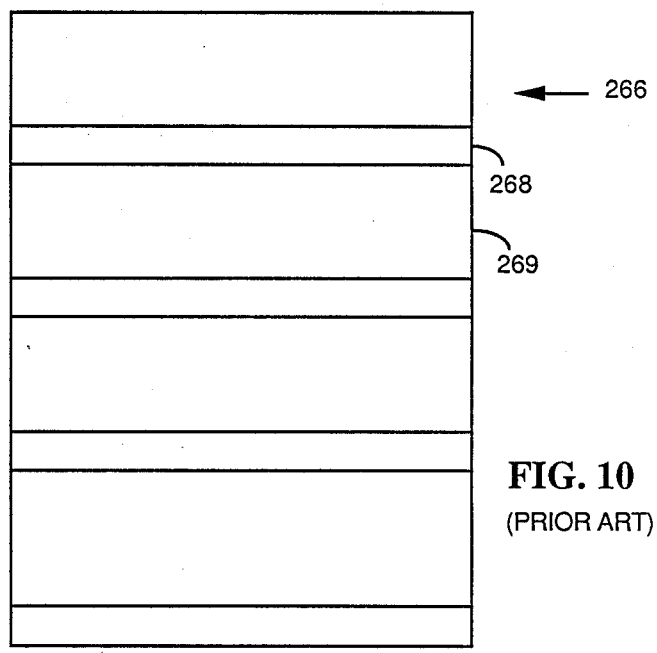
FIG. 10 is an elevation view of a stack of alternating layers of dielectrics that may be used to form the polarization maintaining fiber of FIG. 9.

Referring to FIG. 10, a method of fabricating the polarization maintaining fiber 17 as shown in FIG. 9 involves first forming a stack 266 of alternating layers of materials 268 and 269 having different refractive indices. The stack 266 is heated to form an essentially monolithic block. The block may then be drawn through a succession of dies, or otherwise stretched by methods well-known in the art, to reduce its dimensions to values suitable for use as the core 250. Before drawing, the block may be ground to form a cylinder in order to produce a core having a circular cross section. A cladding having a refractive index less than both refractive indices of the core 250 may be added thereto by any of several standard techniques, such as fusing bulk silicon dioxide, $SiO_2$, onto the core, collapsing $SiO_2$ tubing onto the core, or by reactive deposition of $SiO_2$ from a gaseous mixture.

$GeO_2$ may be used as the high index component and $SiO_2$ as the low index component in the stack 266. Both silica and germania are used in virtually all single mode and multimode fibers because of their low loss and physical compatibility. Combined inhomogeneously with proper fractional thickness they form the core 250 with the refractive indices for both polarizations being large enough to be clad by fused silica.

Well established optical fabrication techniques can be used to fabricate the $SiO_2$ plates from pure bulk $SiO_2$. The $GeO_2$ component may be too thin to be formed by mechanical fabrication techniques. The $GeO_2$ layer may be formed by sputtering a $GeO_2$ film onto an $SiO_2$ substrate. The $GeO_2$ layer may also be formed by coating the $SiO_2$ with a layer of Ge and oxidizing it to $GeO_2$ in a tube furnace.

Other types of high birefringence fiber suitable for use as the polarization maintaining fiber 17 are disclosed in the following U.S. Patents: U.S. Pat. No. 4,549,781 issued Oct. 29, 1985 to Bhagavatula et al. for "Polarization-Retaining Single-Mode Optical Waveguide"; U.S. Pat. No. 4,529,426 issued Jul. 16, 1985 to Pliebel et al. for "Method of Fabricating High Birefringence Fibers"; U.S. Pat. No. 4,465,336, issued Aug. 14, 1984 to Huber et al. for "Waveguide and Method of Manufacturing Same"; and U.S. Pat. No. 4,561,871 issued Dec. 31, 1985 to Berkey for "Method of Making Polarization Preserving Optical Fiber."

Referring to FIG. 1, the polarization maintaining fiber 17 has a smaller refractive index for one polarization component than for the other. Since the velocity of light in the fiber 17 is $v=c/n$, where c is the speed of light in a vacuum and n is the refractive index of the fiber for the particular polarization under consideration, the two polarizations have different velocities in the polarization maintaining fiber 17. The slow wave has velocity $v_s=c/n_1$, and the fast wave has velocity $v_f=c/n_2$, where $n_2>n_1$. The polarization maintaining fiber 17 converts the linearly polarized light input into an elliptically polarized wave due to superposition of the orthogonal fast and slow waves.

If the reference signal that drives the piezoelectric transducers in the phase modulator is sinusoidal with a modulation frequency $\omega_p$, then the time delay $\tau$ between the fast and slow waves may be written as $$\tau = \tau_0 + \Delta\tau\cos\omega_p\tau. \qquad (1)$$

If $\omega_p\tau=2\pi m$, where m is an integer, then the time delay is a maximum or a minimum. An excursion in the time delay changes the output intensity.

After traveling through the polarization maintaining fiber 17, the light is incident upon the analyzer 18. The analyzer 18 may comprise a fiber optic polarizer similar to any of the fiber optic polarizing devices described above, or it may be a bulk optics polarizer, which is well-known in the art.

The optical signal input to the analyzer 18 may be written as $$I\sim(1+\cos\omega\tau), \qquad (2)$$

where $\omega$ is the optical frequency and $\tau$ is the time delay between the fast and slow polarizations over the length of the fiber 17. The phase modulator 25 produces modulation in the relative phase of the fast and slow waves. The driver oscillator 26 acts as an alternating current source having a frequency $\omega_p$ and drives the phase modulator 25.

When the phase modulator 25 is operating, the electrical current output from the detector 20 may be written as $$i\sim(1+\cos[\omega\tau+\phi_p\cos\omega_p\tau]) \qquad (3)$$

This output current is then sent through the bandpass filter, which passes the squeezer frequency $\omega_p$. The signal output from the bandpass filter is then input to a synchronous detector, or lock-in amplifier, which receives a reference signal from the squeezer driver. After demodulation, the signal is $$S_1\sim\sin\omega\tau J_1(\phi_p) \qquad (4)$$

where $J_1$ is the first order Bessel function. This signal $S_1$ is fedback to the source 12 and used to servo the source frequency toward the desired value.

Figure 15:
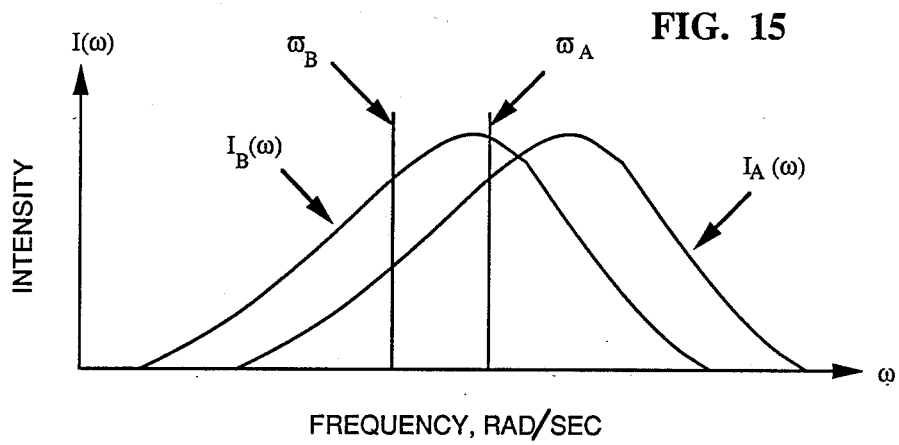
FIG. 15 graphically illustrates the spectral distribution of a laser diode that may be comprise the light source in the systems of FIGS. 1 and 14.

FIG. 15 illustrates the spectral distribution of a single mode laser diode. The phase modulator shifts the spectral distribution function $I(\omega)$ between the curves $I_A(\omega)$ and $I_B(\omega)$. The frequencies $\omega_A$ and $\omega_B$ represent the centroids of the two spectral distributions shown in FIG. 15. The centroid of the source spectral distribution represents an average wavelength or frequency that gives the closed loop gyro scale factor $S=D/(n\gamma)=fD/(nc)$ where D is the diameter of the sensing loop, n is the refractive index of the fiber, $\gamma$ is the wavelength of the light, f is the frequency of the light and c is the free space velocity of light.

Without source stabilization, a shift in the centroid of the spectral distribution causes a change in the scale factor by an amount $\Delta S/S=\Delta f/f$. With the source stabilization system according to the present invention, a shift in the centroid of the spectral distribution changes the output of the reference interferometer. The output of the reference interferometer then is processed to provide a signal that initiates a correction to the shift in the centroid of the spectral distribution.

Figure 16:
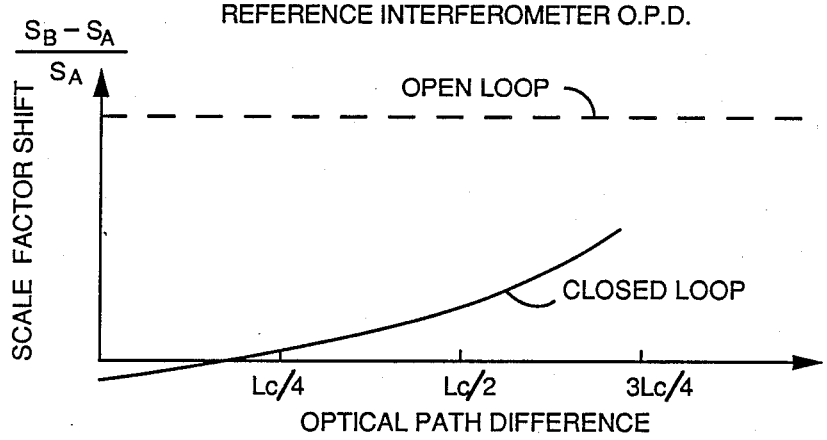
FIG. 16 graphically illustrates stabilization of the scale factor of the fiber optic rotation sensor of FIG. 14 as a function of the optical path difference of the two polarizations in the frequency control system of FIG. 1.

FIG. 16 illustrates the stabilization of the scale factor as a function of the optical path difference. The optimum correction is achieved when the curve representing the shift in scale factor intersects the line that represents the optical path difference. This intersection occurs when the optical path difference is slightly less than Lc/4. The capability of the reference interferometer to stabilize the scale factor is a function of the optical path difference of the arms of the reference interferometer, the rotational rate of the sensing loop and the shape of the spectral distribution. The scale factor linearity is a complicated function of the spectral shape and degrades approximately linearly with the width of the spectral distribution width.

There are several types of optical frequency shifters that may be used in the fiber optic rotation sensor of FIG. 14. FIG. 17 illustrates the effect of a frequency shifter on an optical wave. Consider a circularly polarized input light incident upon a half-wave plate 400 that is rotating at an angular velocity f. The input wave is shown to have a frequency $f_o$. The wave is traveling in the positive z-direction and has polarization vectors along the x- and y-axes that are of equal magnitude and 90° out of phase. Therefore, the polarization vector appears to rotate at angular velocity $f_o$ about the z-axis in a clockwise direction when viewed looking toward the direction of propagation. The half-wave plate 400 rotates in the same direction as the polarization vector so that the output wave is frequency shifted from the input frequency $f_o$ to have a frequency of $f_o+2f$.

FIG. 18 graphically represents the possible frequency outputs from the frequency shifter 44 when it is operated as a single-side-band-suppressed-carrier phase shifter. If the input frequency is $f_o$, then rotating the half-wave plate at frequency f in the direction of polarization of the input beam produces an output of $f_o+2f$. Rotating the half-wave plate 400 at the frequency f opposite in direction to the polarization of the circularly polarized input wave produces an output frequency of $f_o-2f$. Controlling the rotational frequency f permits the output frequency of the quarter-wave plate to have a range of $(f_o \pm 2f_{max})$ where f max is the maximum rotational frequency of the half-wave plate 400.

The amplitude of the output of the frequency shifter 44 is $$\phi(t) = A \exp[i(f_0+2f)t] + B \exp[if_0 t]. \quad (5)$$

The intensity of the output wave is the square of the amplitude and is given by $$I = |\phi(t)|^2 \quad (6)$$

$$I = A^2 + B^2 + 2AB \cos(2ft). \quad (7)$$

The coefficient A is ordinarily much larger than B so that $B^2$ is negligible.

Figure 20:
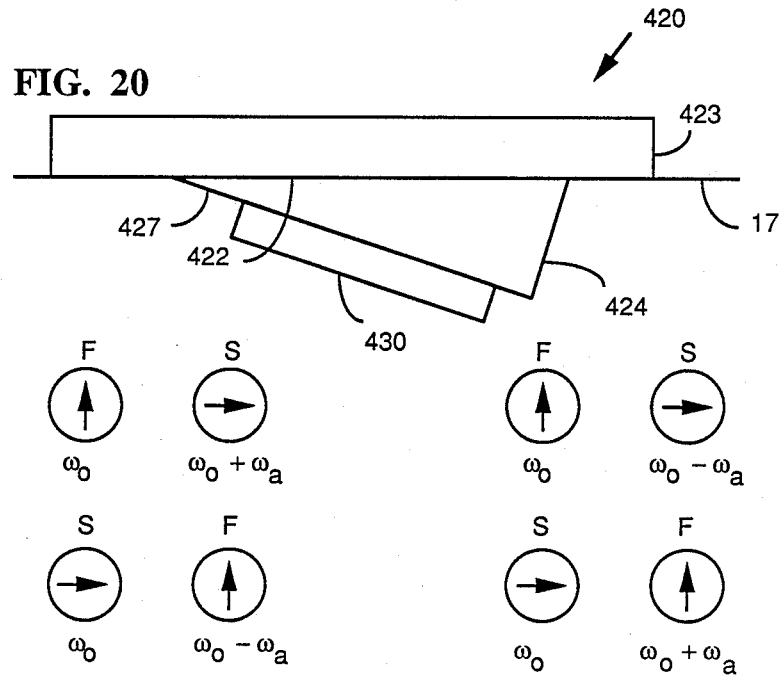
FIG. 20 illustrates a structure for an acoustooptic frequency shifter that may be included in the fiber optic rotation sensor of FIG. 14.

A frequency shifter structure that may be used in the fiber optic rotation sensor 34 of FIG. 14 is shown in FIG. 20. The frequency shifter 44 may include a length 422 of the optical fiber 11 retained between a block 423 that may be formed of quartz and a wedge 424 formed of a material such as aluminum. A metallic layer comprising Cr-Au, for example, is formed on the surface 427 of the wedge 424, and a transducer 430 formed of PZT, for example, is mounted to the metallic block 424. The transducer 430 may be driven by a suitable oscillator (not shown) to launch an acoustic wave at an angle θ in the fiber.

The fiber 11, being a single mode fiber, supports two orthogonal polarizations of the single propagation mode. There are two polarizations because the fiber is birefringent, having different refractive indices for different directions of the electric field in the fiber. The two polarizations are normally uncoupled so that there is no energy transfer from one polarization to the other. A spatially periodic stress pattern imposed on the fiber induces coupling between the two polarizations, leading to power transfer therebetween. It has been found that the power transfer is cumulative only if the spatial period of the stress pattern equals the beat length of the fiber.

Figure 19:
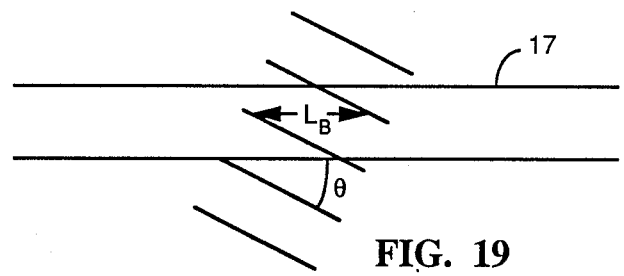
FIG. 19 illustrates an acoustic wavefront impinging upon an optical fiber.

Referring to FIG. 19, the beat length of the optical fiber is $L_B = \lambda/\Delta n$, where $\Delta n$ is the difference in the refractive indices for the two polarizations and λ is the optical wavelength. It has been found that a stress pattern is most effective in causing coupling of the two polarizations when the stress is directed at 45 degrees to the principal axes of birefringence.

The transducer 430 forms a moving stress pattern in the fiber portion 422 by means of the traveling acoustic wave. If the stress pattern moves along the fiber, light coupled from one polarization to the other is shifted in frequency by an amount equal to the frequency of the moving stress pattern because of the motion of the coupling region. For convenience of reference, one of the polarizations will be referred to as "slow" and the other polarization will be referred to as "fast." The velocity of a light wave in a dielectric medium is the free space velocity of light divided by the refractive index of the dielectric medium, or $v = c/n$. Therefore, it may be seen that in a birefringent medium the polarization for which the refractive index is the greater is the slow wave and the polarization for which the refractive index is smaller is the fast wave.

Referring to FIGS. 19 and 20, a plane acoustic wavefront of wavelength $\lambda_a$ is incident upon the fiber portion 422. Phase matching occurs when the component of the beat length $L_B$ in the direction of propagation of the acoustic wave equals the acoustic wavelength. Therefore, from FIGS. 19 and 20 it is seen that $L_B \sin \theta = \lambda^a$. Using a well-known relation between wave velocity, frequency and wavelength to eliminate the acoustic wavelength from the preceding equation gives the acoustic frequency as $f = v/(L_B \sin \theta)$, where v is the acoustic wave velocity in the fiber.

Figure 21:
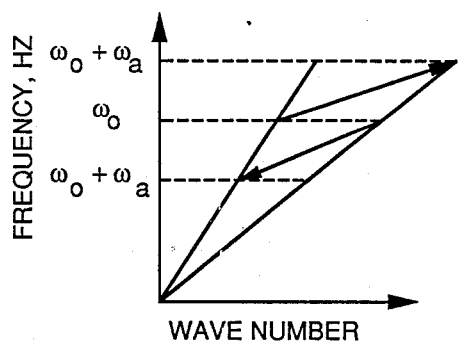
FIG. 21 and 22 illustrate the effect of the acoustooptic frequency shifter of FIG. 20 on an optical signal.

The specific nature of the interaction between the acoustic wave and the two optical polarizations propagated by the fiber can be demonstrated using frequency-wave number diagrams. Referring to FIG. 21, if the acoustic wave travels in the same direction as the light in the fiber 11, light polarized in the fast mode and having a frequency ω couples to the slow mode with the resulting wave having a frequency $\omega + \omega_a$, where $\omega_a$ is the acoustic wave frequency. Light propagating in the slow mode couples to the fast mode and shifts in frequency to $\omega - \omega_a$.

Figure 22:
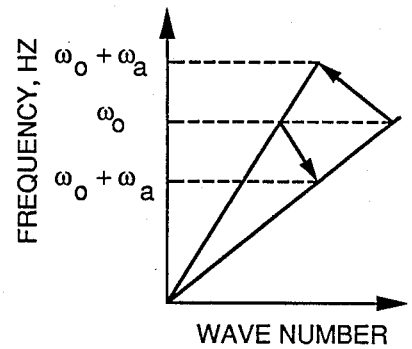

As shown in FIG. 22, if the acoustic wave propagates in a direction opposite to that of the light in the fiber 11, the frequency shifting characteristics of the system reverse. Specifically, light propagating in the fast mode couples to the slow mode with a change in frequency to $\omega - \omega_a$, and light propagating in the slow mode couples to the fast mode with a change in frequency to $\omega + \omega_a$.

Therefore, the frequency shifter 420 as shown in FIG. 20 is a single side band frequency shifter if only light of a single polarization impinges upon the portion of the fiber 11 having the periodic moving stress pattern therein. In practice, the selected polarization may have small amounts of the carrier frequency and the sideband having the opposite frequency shift because of the finite extinction ratio of the polarizers included in the gyroscope and other factors.

Referring to FIG. 23, a frequency shifter 450 that may be included in the rotation sensor 34 comprises a length of the fiber 11 mounted in a grooved substrate 452. An electrode 454 is mounted in the groove 456 below the fiber 11. A portion of the fiber cladding 460 is ground away to form an interaction region 461 near the core 462. An interaction material 464 formed of an electrooptically active material is mounted on the region of the fiber where the cladding was removed. A pair of electrodes 466 and 468 are mounted on opposite ends of the interaction material, and an electrode 470 is mounted on the interaction material in generally parallel alignment with the electrode 454. An oscillator 472 supplies voltage to the electrode 470. A phase shifter 474 receives the oscillator output, shifts its phase and then applies the phase shifted signal to the electrode 468. The electrodes 466 and 456 are grounded.

Application of the oscillator signal to the interaction material 464 changes its refractive index according to the electrooptic effect. These changes in refractive index in the interaction material 464 cause changes in the effective refractive index of the fiber 11. These changes are oscillatory at the frequency of the oscillator signal. Since the speed of light is $v = c/n$ where n is the refractive index of the fiber, the changes in refractive index modulate the velocity of optical signals in the frequency shifter 450. These velocity modulations are seen as modulations in the frequency of the light.

Although the present invention has been described with reference to specific embodiments, it should be understood that these embodiments are exemplary preferred embodiments and that modifications may be made without departing from the scope of the invention as defined in the appended claims.

What is claimed is:

1. A device for stabilizing the frequency of an optical signal output from a optical source, comprising:
    a length of polarization maintaining optical fiber for guiding an optical signal while maintaining the polarization thereof;
    means for introducing an optical signal having a pair of linear polarization components from the light source into the length of polarization maintaining optical fiber, the polarization components having different propagation times therein;
    fiber optic phase modulator means for modulating at a reference frequency the phase difference of the two linear polarization components guided by the length of polarization maintaining optical fiber;
    means for producing an error signal indicative of the intensity as a function of the reference frequency of an optical signal output from the length of polarization maintaining optical fiber; and
    means for applying the error signal to the optical source to servo the frequency of the optical signal output from the optical source to a predetermined value.

2. The device of claim 1, further including:
    a first polarizer having a polarization axis oriented at 45° to the principal axes of the length of polarization maintaining optical fiber, said first polarizer being positioned to provide light of a predetermined polarization to the length of polarization maintaining optical fiber;
    a second polarizer having a polarization axis oriented at 45° to the principal axes of the length of polarization maintaining optical fiber, the second polarizer being positioned to receive optical signals output from the length of polarization maintaining optical fiber; and
    means for detecting optical signals output from the second polarizer.

3. The device of claim 2, further including:
    bandpass filter means connected to the detecting means, the bandpass filter being formed to have an output signal of a predetermined modulation frequency;
    synchronous detector means connected to the band pass filter means to receive the output signal therefrom; and
    means for providing an error signal from the synchronous detector means to the optical source such that the optical source produces an optical signal having a frequency that causes a reduction in the error signal.

4. The device of claim 3, further including a driver oscillator connected to the phase modulator to modulate the phase of optical signals guided by the length of polarization maintaining optical fiber at the modulation frequency.

5. The device of claim 1, further including:
    detecting means for producing an electrical signal indicative of the optical signal output from the length of polarization maintaining optical fiber;
    band pass filter means connected to the detecting means, the band pass filter being formed to have an output signal at the reference frequency;
    synchronous detector means connected to the band pass filter means to receive the output signal therefrom; and
    means for providing an error signal from the synchronous detector means to the optical source such that the optical source produces an optical signal having a frequency that causes a reduction in the error signal.

6. The device of claim 5, further including a driver oscillator connected to the phase modulator to modulate the phase of optical signals guided by the polarization maintaining optical fiber at the modulation frequency.

7. A method for stabilizing the frequency of an optical signal output from a optical source, comprising the steps of:
    guiding an optical signal with a length of polarization maintaining optical fiber to maintain the polarization of the optical signal;
    introducing an optical signal having a pair of linear polarization components from the light source into the length of polarization maintaining optical fiber, the polarization components having different propagation times therein;
    modulating the phase difference of the two polarization components guided by the length of polarization maintaining optical fiber with a signal having a predetermined reference frequency;
    producing an error signal indicative of the intensity as a function of the reference frequency of an optical signal output from the length of polarization maintaining optical fiber; and
    applying the error signal to the optical source to servo the frequency of the optical signal output from the optical source to a predetermined value.

8. The method of claim 7, further including the steps of:
    providing light of a predetermined polarization to the length of polarization maintaining optical fiber;

analyzing the output of the length of polarization maintaining optical fiber to provide an optical signal having only a selected polarization; and detecting optical signals having the selected polarization.

9. The method of claim 8, further including the steps of:

filtering electrical signals indicative of optical signals having the selected polarization with a band pass filter to provide an output signal of a predetermined modulation frequency;

connecting synchronous detector means to the band pass filter to receive the output signal therefrom; and providing an error signal from the synchronous detector means to the optical source such that the optical source produces an optical signal having a frequency that causes a reduction in the error signal.

10. The method of claim 9, further including the step of connecting a driver oscillator to the phase modulator to modulate the phase of optical signals guided by the length of polarization maintaining optical fiber at the modulation frequency.

11. The method of claim 7, further including the steps of:

aligning a first polarizer to have a polarization axis oriented at 45° to the principal axes of the polarization maintaining optical fiber to provide light of a predetermined polarization to the polarization maintaining optical fiber;

aligning a second polarizer to have a polarization axis oriented at 45° to the principal axes of the polarization maintaining optical fiber,;

positioning the second polarizer to receive optical signals output from the polarization maintaining optical fiber; and detecting optical signals output from the second polarizer.

12. The method of claim 11, further including the steps of:

filtering electrical signals indicative of optical signals having the selected polarization with a band pass filter to provide an output signal of a predetermined modulation frequency;

synchronously detecting the output signal from the band pass filter; and providing an error signal produced from the synchronously detected signal to the optical source such that the optical source produces an optical signal having a frequency that causes a reduction in the error signal.

13. A fiber optic rotation sensing system, comprising:
an optical source;
a first fiber for receiving light from the optical source;
a second optical fiber having a sensing coil formed therein;
optical coupling means for coupling light between the first and second optical fibers;
means optically coupled to the optical source for stabilizing the frequency of an optical signal output from the optical source, including:
a length of polarization maintaining optical fiber for guiding an optical signal while maintaining the polarization thereof;
means for introducing an optical signal having a pair of linear polarization components from the light source into the length of polarization maintaining optical fiber, the polarization components having different propagation times therein;

fiber optic phase modulator means for modulating at a reference frequency the phase difference of the two linear polarization components guided by the length of polarization maintaining optical fiber;

means for producing an error signal indicative of the intensity as a function of the reference frequency of an optical signal output from the length of polarization maintaining optical fiber; and means for applying the error signal to the optical source to servo the frequency of the optical signal output from the optical source to a predetermined value;

means for producing a pair of counterpropagating waves in the sensing coil so that the waves interfere and produce an interference pattern indicative of the rotation rate of the sensing coil; and means for processing optical signals output from the sensing coil to determine its rotation rate.

14. The fiber optic rotation sensing system of claim 13, further including:

a first polarizer having a polarization axis oriented at 45° to the principal axes of the polarization maintaining guiding means, said first polarizer being positioned to provide light of a predetermined polarization to the polarization maintaining guiding means;

a second polarizer having a polarization axis oriented at 45° to the principal axes of the polarization maintaining guiding means, the second polarizer being positioned to receive optical signals output from the polarization maintaining guiding means; and means for detecting optical signals output from the second polarizer.

15. The fiber optic rotation sensing system of claim 14, further including:

band pass filter means connected to the detecting means, the band pass filter being formed to have an output signal of a predetermined modulation frequency;

synchronous detector means connected to the band pass filter means to receive the output signal therefrom; and means for providing an error signal from the synchronous detector means to the optical source such that the optical source produces an optical signal having a frequency that causes a reduction in the error signal.

16. The fiber optic rotation sensing system of claim 15, further including a driver oscillator connected to the phase modulator to modulate the phase of optical signals guided by the polarization maintaining guiding means at the modulation frequency.

17. The fiber optic rotation sensing system of claim 13 wherein the polarization maintaining guiding means comprises a length of polarization maintaining optical fiber having a pair of principal axes.

18. The fiber optic rotation sensing system of claim 21, further including:

a first polarizer having a polarization axis oriented at 45° to the principle axes of the polarization maintaining optical fiber, said first polarizer being positioned to provide light of a predetermined polarization to the polarization maintaining optical fiber;

a second polarizer having a polarization axis oriented at 45° to the principal axes of the polarization maintaining optical fiber, the second polarizer being positioned to receive optical signals output from the polarization maintaining optical fiber; and means for detecting optical signals output from the second polarizer.

19. The fiber optic rotation sensing system of claim 18, further including:

band pass filter means connected to the detecting means, the band pass filter being formed to have an output signal of a predetermined modulation frequency;

synchronous detector means connected to the band pass filter means to receive the output signal therefrom; and means for providing an error signal from the synchronous detector means to the optical source such that the optical source produces an optical signal having a frequency that causes a reduction in the error signal.

20. The fiber optic rotation sensing system of claim 19, further including a driver oscillator connected to the phase modulator to modulate the phase of optical signals guided by the polarization maintaining optical fiber at the modulation frequency.

21. A method for sensing rotations, comprising the steps of:

producing a light beam with an optical source;

receiving light from the optical source with a first optical fiber;

forming a sensing coil in a second optical fiber;

coupling light between the first and second optical fibers; and controlling the frequency of an optical signal output from a optical source with means optically coupled to the optical source, including the steps of:

guiding an optical signal with a length of polarization maintaining optical fiber to maintain the polarization of the optical signal;

introducing an optical signal having a pair of linear polarization components from the light source into the length of polarization maintaining optical fiber, the polarization components having different propagation times therein;

modulating the phase difference of the two polarization components guided by the length of polarization maintaining optical fiber with a signal having a predetermined reference frequency;

producing an error signal indicative of the intensity as a function of the reference frequency of an optical signal output from the length of polarization maintaining optical fiber; and applying the error signal to the optical source to servo the frequency of the optical signal output from the optical source to a predetermined value;

producing a pair of counterpropagating waves in the sensing coil so that the waves interfere and produce an interference pattern indicative of the rotation rate of the sensing coil; and processing optical signals output from the sensing coil to determine its rotation rate.

22. The method of claim 21, further including the steps of:

providing light of a predetermined polarization to the polarization maintaining guiding means;

analyzing the output of the polarization maintaining guiding means to provide an optical signal having only a selected polarization; and 23. The method of claim 22, further including the steps of:

filtering electrical signals indicative of optical signals having the selected polarization with a band pass filter to provide an output signal of a predetermined modulation frequency;

connecting synchronous detector means to the band pass filter to receive the output signal therefrom; and providing an error signal from the synchronous detector means to the optical source such that the optical source produces an optical signal having a frequency that causes a reduction in the error signal.

24. The method of claim 23, further including the step of connecting a driver oscillator to the phase modulator to modulate the phase of optical signals guided by the length of polarization maintaining optical fiber at the modulation frequency.

25. The method of claim 24, further including the step of forming the length of polarization maintaining optical fiber to comprise a length of polarization maintaining optical fiber having a pair of principal axes.

26. The method of claim 25, further including the steps of:

aligning a first polarizer to have a polarization axis oriented at 45° to the principal axes of the polarization maintaining optical fiber to provide light of a predetermined polarization to the polarization maintaining optical fiber;

aligning a second polarizer to have a polarization axis oriented at 45° to the principal axes of the polarization maintaining optical fiber,;

positioning the second polarizer to receive optical signals output from the polarization maintaining optical fiber; and detecting optical signals output from the second polarizer.

27. The method of claim 26, further including the steps of:

filtering electrical signals indicative of optical signals having the selected polarization with a band pass filter to provide an output signal of a predetermined modulation frequency;

synchronously detecting the output signal from the band pass filter; and providing an error signal produced from the synchronously detected signal to the optical source such that the optical source produces an optical signal having a frequency that causes a reduction in the error signal.

28. The method of claim 27, further including the step of connecting a driver oscillator to the phase modulator to modulate the phase of optical signals guided by the polarization maintaining optical fiber at the modulation frequency.

* * * * *